United States Patent [19]

Daniel et al.

[11] 4,030,038

[45] June 14, 1977

[54] MULTIPLE DUMPING INTEGRATOR

[75] Inventors: Donald D. Daniel, China Lake; Roger V. Wilcox, Ridgecrest, both of Calif.

[73] Assignee: The United States of America as represented by the Secretary of the Navy, Washington, D.C.

[22] Filed: Feb. 27, 1976

[21] Appl. No.: 661,916

[52] U.S. Cl. .............................. 328/127; 307/229; 235/183
[51] Int. Cl.² ...................................... G06G 7/18
[58] Field of Search ........... 307/229, 230; 328/127, 328/128, 151; 235/187, 183

[56] References Cited

UNITED STATES PATENTS

| | | | |
|---|---|---|---|
| 3,218,559 | 11/1965 | Applebaum | 328/127 |
| 3,594,649 | 7/1971 | Rauch | 328/127 |
| 3,903,432 | 9/1975 | Bumbardner | 307/229 |

Primary Examiner—Stanley D. Miller, Jr.
Assistant Examiner—B. P. Davis
Attorney, Agent, or Firm—R. S. Sciascia; Roy Miller; W. Thom Skeer

[57] ABSTRACT

A multiple dumping integrator having several periodic dumping integrators, all sharing the same analog-to-digital converter. A selector dumps each periodic dumping integrator in a regular sequence, choosing the longest running such integrator for the next dump.

3 Claims, 2 Drawing Figures

B = TIME OF TARGET ILLUMINATION

MULTIPLE DUMPING INTEGRATOR

BACKGROUND OF THE INVENTION

This invention relates to signal integration devices, and more particularly to a digital delay line integrator.

Developmments in integrated circuit (IC) technology have made possible compact, yet sophisticated, signal integration techniques in airborne search radars. Radar integration is normally noncoherent and performed at video frequencies, rather than coherent as it would be if it were performed at IF. This is because a mere half wavelength change at RF in the range between radar and target results in 180° phase change at IF. With noncoherent integration, thermal noise adds up as fast as target and clutter signals. The improved visibility of the return echo signals results from the fact that, over time, noise fluctuations average out so that the integrated noise signals become a relatively smooth baseline under the return echoes. Even though integration is implemented physically as a simple addition process, it may be considered an averaging process because the overall system gain is arbitrarily chosen to give a convenient output level.

Integration may be performed with continuous storage devices such as CRT screens and analog delay lines, or discrete storage devices such as capactitors and digital circuits. The signal level in a discrete storage device represents in some fashion the returns from some finite range interval. Each though the time interval that is sampled to provide the signal to store in a discrete storage device may be chosen arbitrarily small, the range interval represented cannot be smaller than a resolution cell. However, the circuit designer thinks in terms of time intervals rather than range intervals, so to him a resolution cell is a time interval. The range resolution, or resolution cell, of a radar is normally taken to be $c\tau/2$, where $c$ is the speed of light and $\tau$ is the transmitted pulse duration.

Since a separate storage device must be used for each resolution cell, many storage devices must be used to cover a large range interval if discrete storage devices are used. For this reason, analog delay lines have been proposed as a simpler means of integrating the returns from many resolution cells simultaneously. The output of the delay line would be added to the incoming video signals and the sum would be fed into the input of the delay line. If the delay line were the same length (in units of time) as the pulse repetition interval (PRI) of the transmitter, then incoming returns from any particular range would be added to previous returns from the same range, and a satisfactory integration process would result. However, it has proved difficult to fabricate analog delay lines with the required combination of delay, bandwidth, and small size. Recently, IC technology has advanced to the point that digital delay lines now may be constructed which are suitable for these purposes by combining large numbers of storage devices in a single IC. Just a few such ICs can be used to make a digital delay line.

A digital delay line may be constructed by connecting a separate shift register IC to each of the output terminals of an analog to digital (A/D) converter. An A/D converter has one analog input, as many parallel digital output terminals as there are bits of resolution in the conversion process, and a clock input. When a clock pulse arrives, a digital word, or binary number, appears at the output terminals. This digital word represents the voltage level at the analog input just before the arrival of the clock pulse. This digital output is held until the next clock pulse.

Digital delay lines are constructed with an A/D converter and as mangy shift registers as there are bits of resolution, and therefore output terminals, in the A/D converter. A digital delay line (DDL) integrator in a radar does not require the use of a fixed PRI the way an analog delay line does, since the signals remain fixed in the delay line when the digital clock signal is withheld.

The simplest and least expensive digital delay line integrator is the periodic dumping integrator. It integrates for a fixed number of pulses, then dumps the stored data and starts integrating again. The partial feedback integrator differs from the periodic dumping integrator in that it is continuously dumping. The serial delay line integrator does not employ feedback, but sends the signal serially through successive delay lines in series with each other. The number of delay lines used is one less than the number of pulses to be integrated. The signal going into each of the delay lines, and the one coming out of the last delay line, are added to form the output signal.

The disadvantage of the periodic dumping integrator is the limited amount of data which it can integrate. The partial feedback integrator is a leaky integrator, i.e., for high efficiency the decay time is long, but for short decay time the efficiency is low. The serial delay line integrator processes more data, but the number of delay lines required is prohibitive.

SUMMARY OF THE INVENTION

The multiple dumping integrator is formed of several single periodic dumpers except that all of the periodic dumpers share the same A/D converter. The outputs of the periodic dumpers are applied to an output selector, which would normally consist of a circuit known as a digital multiplexer. Each periodic dumper is dumped in turn in a regular sequence, and the output selector selects for output only the one which has been running the longest at any given time, switching to a new one after each dump.

The advantages and novel features of the present invention will become apparent from the following detailed description of the invention when considered in conjunction with the accompanying drawing.

DESCRIPTION OF THE PREFERRED EMBODIMENT

Figure 1:
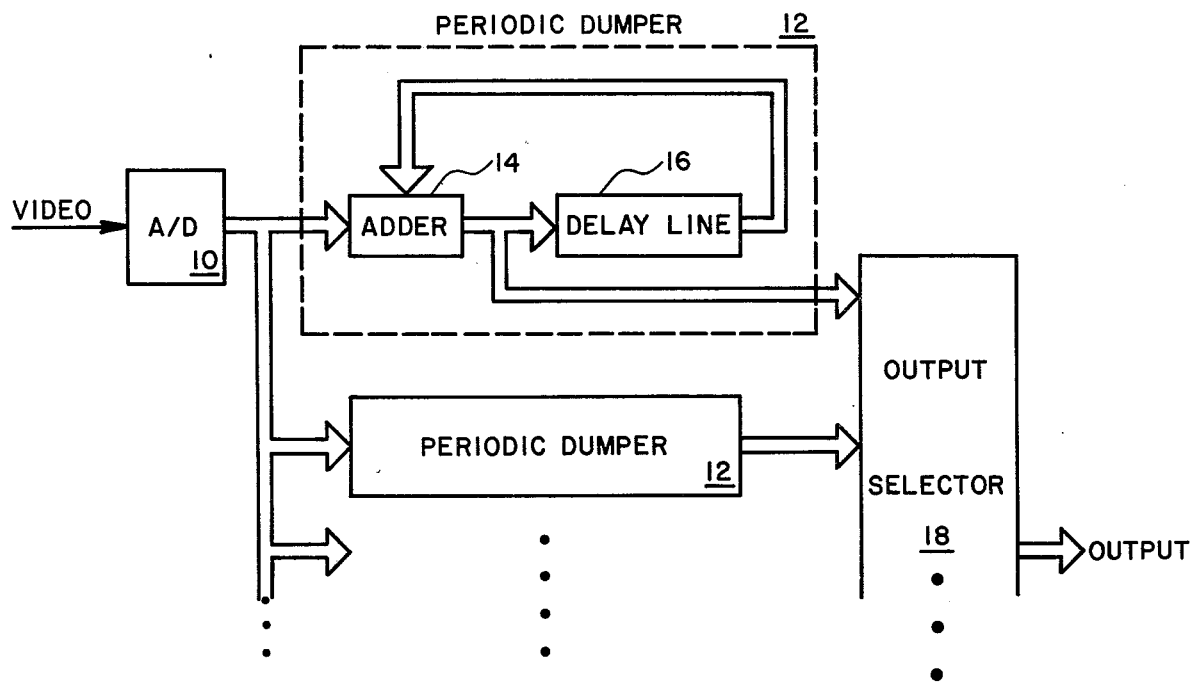
FIG. 1 is a block diagram of the integrator.

Referring now to FIG. 1, an analog-to-digital (A/D) converter 10 converts incoming analog information, such as video, into as many parallel bits of resolution as desired. At least 3-bit A/D conversion is required to attain results comparable to analog integration. Generally, the more bits of resolution used, the slower and more expensive the A/D converter becomes. A plurality of periodic dumpers 12 receive the parallel bits from the A/D converter 10, a single A/D converter serving all the periodic dumpers. Each periodic dumper 12 consists of an adder 14 and a digital delay line 16, the adder adding the output of the delay line to the input data from the A/D converter 10. An output selector 18 selects for output the output of the periodic dumper 12 which has been running the longest at any given time, dumping each periodic dumper in turn in a regular sequence, switching to a new one after each dump. The output selector 18 is normally a circuit known as a digital multiplexer.

The output of the output selector 18 may be connected either to a digital threshold circuit, known as a digital comparator, or to a digital-to-analog (D/A) converter for further processing or to other processing circuitry.

The digital delay line 16 need not be implemented with shift registers, since a random access memory (RAM) and a counter can be combined to simulate a shift register. Though slightly more complicated, it might be a preferable approach, depending on the relative price and speed of available RAMs and shift registers at any given time.

The incoming video is digitized by the A/D converter 10 into $n$ range intervals per pulse repetition interval (PRI) of the radar, and the digital data is fed into the periodic dumpers 12 where it is integrated such that the video from respective PRIs is added to the data from the same range intervals of previous PRIs. The periodic dumpers 12 are dumped in sequence upon command from the output selector 18 and the resulting integrated data is available as digital data analog data, depending upon how the output is processed.

Figure 2:
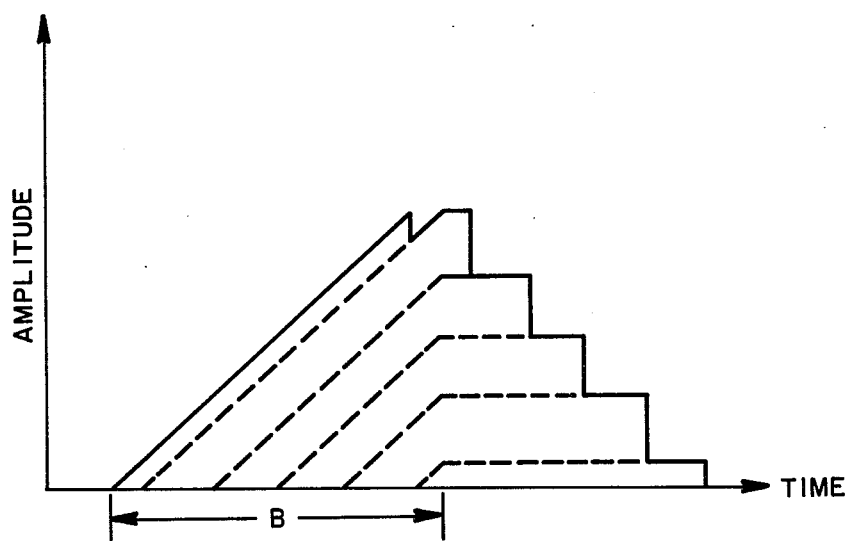
FIG. 2 is a graph of the output of the integrator as a radar antenna scans across a target.

The integration efficiency of the multiple dumping integrator depends on what part of the cycle the system is in when the target first comes into view, and on the number of periodic dumpers 12. If the target comes into view just as periodic dumper 12 is dumped and restarted, the efficiency will be the same as for a serial delay line integrator. If the target comes into view midway between dumps, which is the worst case, the efficiency will be $(1 - \frac{1}{2}Q)$, where Q is the number of periodic dumpers 12. Thus, for Q=5, the worst case efficiency is 90%. This case is illustrated in FIG. 2. With only five delay lines, the integrator of this invention achieves 90% of the performance of a serial delay line integrator with a large number of delay lines.

For a simple periodic dumper, where Q=1, the worst case efficiency is 50%. This is due to the possibility that the dump will occur midway through the time interval during which the target is illuminated. The advantage of the multiple dumping integrator over a simple periodic dumper is readily apparent.

Obviously, many modifications and various of the present invention are possible in light of the above teachings. For example, by deleting the analog-to-digital converter and using analog delay lines, the system can be used as an analog multiple dumping integrator rather than digital as described in detail hereinabove. It is therefore to be understood that, within the scope of the appended claims, the invention may be practiced otherwise than as specifically described.

What is claimed is:

1. A multiple dumping integrator comprising:
    a source of digital signals; a plurality of periodic dumping integrators connected in parallel having a common input effectively connect to said source of digital signals and individual outputs to simultaneously integrate input data; and
    an output selector having an input connected to the outputs of said periodic dumping integrators to sequentially select each of said outputs in turn for display.

2. A multiple dumping integrator as recited in claim 1 wherein each of said periodic dumping integrators comprises:
    means for adding connected to the output of said source of digital signals, the output of said adding means being connected as the input to said output selector; and
    a delay line connected to said adding means such that the output of said adding means is the input to said delay line, and the output of said delay line is added to the output of said converter, said delay line having a delay time such that said input data is integrated.

3. A multiple dumping integrator as recited in claim 1 in which said source of digital signals comprises an analog-to-digital con verter to convert input data into digital data having a plurality of parallel bits before said input data is input to said periodic dumping integrators, and wherein said adding means and said delay lines comprise digital circuits configured for processing said parallel bits.

* * * * *